United States Patent [19]

O'Leary

[11] Patent Number: 4,731,130
[45] Date of Patent: Mar. 15, 1988

[54] SOLDERING COMPOSITION
[75] Inventor: Daniel J. O'Leary, Natick, Mass.
[73] Assignee: GTE Government Systems Corporation, Waltham, Mass.
[21] Appl. No.: 54,697
[22] Filed: May 27, 1987
[51] Int. Cl.[4] .............................................. B23K 35/34
[52] U.S. Cl. ........................................ 148/24; 148/26
[58] Field of Search .................................. 148/24, 26
[56] References Cited
U.S. PATENT DOCUMENTS
3,597,285  8/1971  Aronberg ............................. 148/24
3,703,254 11/1972  Maierson ............................. 148/24
4,235,649 11/1980  Inamura .............................. 148/24

Primary Examiner—Peter D. Rosenberg
Attorney, Agent, or Firm—J. Stephen Yeo

[57] ABSTRACT

A solder paste contains solder plated copper spheres in addition to particulate solder and flux. The paste can be used to solder leadless component carriers or the like to printed circuit boards. After melting the solder, the copper spheres are embedded in the resulting solder matrix, offsetting the carrier from the printed circuit board.

2 Claims, 2 Drawing Figures

SOLDERING COMPOSITION

RELATED COPENDING APPLICATION

Ser. No. 54,696 filed May 27, 1987. Method of Soldering Leadless Component Carriers or The Like is concerned with a method of soldering using the composition such as that of the present application.

BACKGROUND OF THE INVENTION

This invention is concerned with soldering compositions.

Leadless component carriers are presently being used to increase component density on printed circuit boards as compared to that of leaded carriers. Leadless component carriers have electrical contacts nearly flush with the surface intended to be nearest the printed circuit board. It is known to be desirable to have this surface spaced somewhat (e.g., 10 mils) from the printed circuit board. This allows post soldering removal of flux residue and facilitates board cleaning. Furthermore, such a space tends to improve survival after thermal cycling.

Previous methods have used spacers or standoffs between the carrier and the board. One such technique is the placement of a dot of an organic material, such as an epoxy adhesive, under the carrier before soldering. Such materials, however, expand during thermal cycling, stressing the solder joint and increasing failure rates. Another method calls for placement of a removable spacer between the carrier and board, but this can cause missed solder joints because of a lack of contact between the component and solder paste, and requires hand soldering which is not cost-effective. Height and solder quality is operator sensitive.

Accordingly, an object of the invention is to provide a soldering composition suitable for soldering leadless component carriers to printed circuit boards which automatically spaces the carrier from the board.

SUMMARY OF THE INVENTION

Briefly, according to one aspect of the invention, a solder paste is provided which includes particulate solder, flux, and solder plated copper powder.

DETAILED DESCRIPTION OF THE INVENTION

Figure 1:
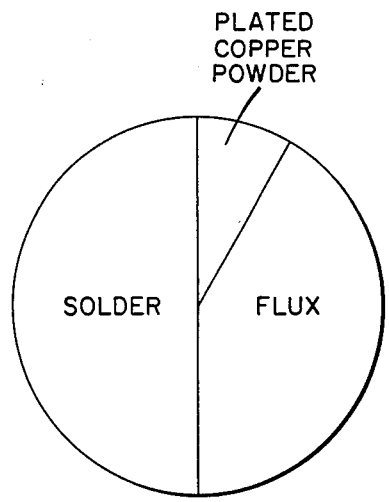
FIG. 1 is a graph representing the composition of the soldering paste of the invention.

A solder paste embodying the invention is represented by the graph of FIG. 1, and includes about 8% by weight of tin/lead plated copper powder, soldering flux, and tin/lead solder spheres.

Figure 2:
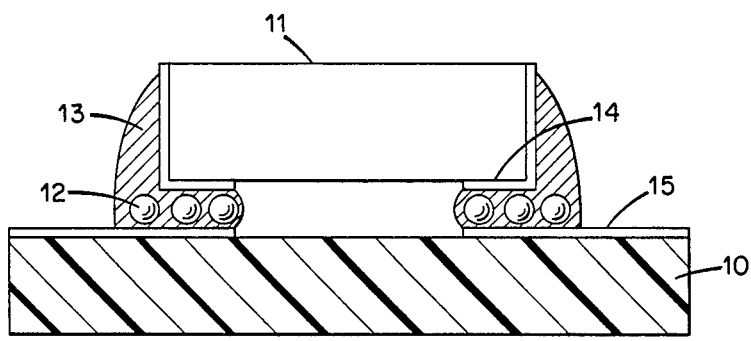
FIG. 2 is a schematic view of a leadless component carrier soldered to a printed circuit board in using the soldering paste of the invention.
Figure 1:
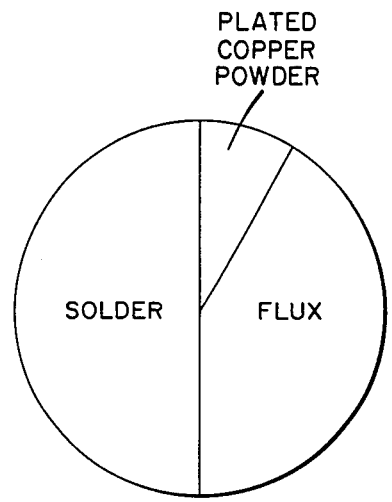
Figure 2:
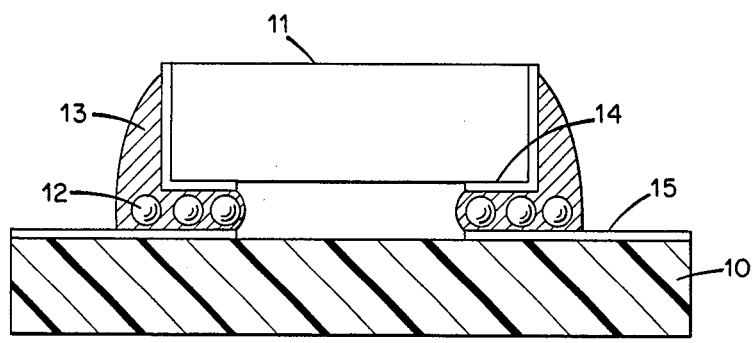
Figure 1:
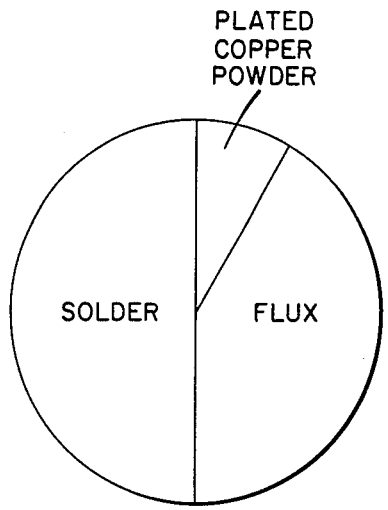
Figure 2:
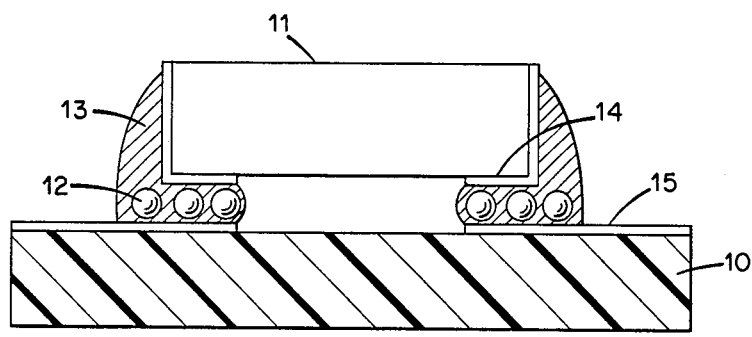

To use the paste, it is screened or otherwise applied onto conductive strips 15 of printed circuit board 10, seen in FIG. 2. A leadless component carrier 11 or the like is mounted on board 10. The paste is then heated by vapor phase, infrared or other means until the solder spheres melt and flow, thereby soldering the leadless component carrier 11 to the printed circuit board 10. The copper powder 12 remains in a solder matrix 13 between the printed circuit board 10 and the carrier's contact 14 providing the desired offset.

Copper powder has been found to be the best spacer material. Glass tends to float in molten solder and gold is too brittle.

The copper powder preferably consists of copper spheres having a size in the range of $-60$ sieve to $+180$ sieve. The particles are cleaned and solder plated with a tin/lead eutectic having between 50 to 70 percent tin by weight.

The solder plated copper is mixed with particulate tin/lead solder in the form of spheres and flux to make a solder paste for practicing the invention.

It will be appreciated that modifications and variations to the composition may be made by those skilled in the art. Therefore, the invention is to be defined by the scope of the claims.

I claim:

1. A soldering composition suitable for soldering leadless component carriers and to provide an offset to printed circuit boards, comprising:
    (a) particulate solder;
    (b) flux; and
    (c) solder plated copper powder.
2. The composition of claim 1 wherein said copper powder is in the form of copper spheres in the range of $-60$ sieve to $+180$ sieve.

* * * * *